United States Patent
Jiang (10) Patent No.: US 11,114,651 B2
(45) Date of Patent: Sep. 7, 2021

(54) APPARATUS AND METHOD FOR MANUFACTURING CURVED DISPLAY PANEL

(71) Applicant: Wuhan China Star Optoelectronics Technology Co., Ltd., Wuhan (CN)

(72) Inventor: Guoqiang Jiang, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 266 days.

(21) Appl. No.: 16/484,116

(22) PCT Filed: Jun. 22, 2017

(86) PCT No.: PCT/CN2017/089610
§ 371 (c)(1),
(2) Date: Aug. 7, 2019

(87) PCT Pub. No.: WO2018/205362
PCT Pub. Date: Nov. 15, 2018

(65) Prior Publication Data
US 2020/0028124 A1 Jan. 23, 2020

(30) Foreign Application Priority Data
May 8, 2017 (CN) .......................... 201710323980.2

(51) Int. Cl.
*H01L 51/56* (2006.01)
*H01L 51/52* (2006.01)

(52) U.S. Cl.
CPC .......... *H01L 51/56* (2013.01); *H01L 51/5237* (2013.01); *H01L 2251/5338* (2013.01)

(58) Field of Classification Search
CPC ................. H01L 51/56; H01L 51/5237; H01L 2251/5338; H01L 27/32; H01L 51/0097; H01L 51/50; B32B 37/10; B32B 38/1866; Y02E 10/549
See application file for complete search history.

(56) References Cited

U.S. PATENT DOCUMENTS

| | | | | |
|---|---|---|---|---|
| 2014/0002973 A1* | 1/2014 | Lee | ...................... | H04M 1/0268 361/679.01 |
| 2014/0002975 A1* | 1/2014 | Lee | ...................... | H05K 5/0217 361/679.01 |
| 2016/0226020 A1* | 8/2016 | Jing | ...................... | H01L 51/5253 |
| 2018/0086043 A1* | 3/2018 | Lee | ...................... | G06F 1/1601 |

* cited by examiner

*Primary Examiner* — Kevin Quarterman (57) ABSTRACT

An apparatus and a method for manufacturing a curved display panel are provided. The apparatus includes a carrying machine, a flexible bag, a supporting machine, and an infusion equipment. The carrying machine is used to carry a curved cover. The flexible bag is used to fasten a flexible display device. The supporting machine is used to fasten the flexible bag. The infusion equipment is used to infuse a liquid substance into the flexible bag so that the flexible display device is attached the curved cover. The disclosure can avoid gaps presented between the flexible display device and the curved cover.

20 Claims, 5 Drawing Sheets

APPARATUS AND METHOD FOR MANUFACTURING CURVED DISPLAY PANEL

RELATED APPLICATIONS

This application is a National Phase of PCT Patent Application No. PCT/CN2017/089610 having International filing date of Jun. 22, 2017, which claims the benefit of priority of Chinese Patent Application No. 201710323980.2 filed on May 8, 2017. The contents of the above applications are all incorporated by reference as if fully set forth herein in their entirety.

FIELD AND BACKGROUND OF THE INVENTION

The present disclosure relates to the field of display technologies, and in particular, to an apparatus and method for manufacturing a curved display panel.

In a manufacture of a conventional curved display panel, a flexible display panel should be attached to a curved cover.

A conventional technical solution for attaching the flexible display panel to the curved cover is as follows.

The flexible display panel is attached to an airbag, and the airbag is inflated to bend the flexible display panel, and then the flexible display panel in a bending state is attached to an inner surface of the curved cover.

In practice, inventors have found that the prior art has at least problems described below.

The traditional curved cover has bending portions. The bending portions are located on both sides of a central area of the curved cover. The inner surface of the bending portion is difficult to completely attach to the flexible display panel. At this time, a gap may occur between the flexible display device and the curved cover at a position corresponding to the bending portion.

Accordingly, it is necessary to provide a new technical solution to solve the above technical problems.

SUMMARY OF THE INVENTION

An object of the present disclosure is to provide an apparatus and method for manufacturing a curved display panel that avoids a gap between a flexible display device and a curved cover.

In order to solve the above problems, the technical solutions of the present disclosure are as follows.

An apparatus for manufacturing a curved display panel includes: a carrying machine configured to carry a curved cover; a flexible bag configured to fasten a flexible display device which is to be attached to the curved cover, where the flexible display device is disposed below the flexible bag in a vertical direction; a supporting machine configured to fasten the flexible bag, where the flexible bag is disposed below the supporting machine in the vertical direction; and an infusion equipment configured to infuse a liquid substance into the flexible bag when at least one portion of the flexible display device is located above the curved cover in the vertical direction, such that the flexible display device is attached to a central area and a bending area of an inner surface of the curved cover under a pressure applied by the liquid substance; the infusion equipment is further configured to infuse a gas into the flexible bag before infusing the liquid substance into the flexible bag, such that the flexible display device is bent under a tension applied by the flexible bag; and the liquid substance is configured to apply the pressure to the flexible display device through the flexible bag to eliminate a gap between the flexible display device and the bending area of the inner surface of the curved cover during a process of bonding the flexible display device to the curved cover.

In the above apparatus for manufacturing the curved display panel, the apparatus further includes: a closed chamber configured to accommodate the supporting machine, the carrying machine, the flexible bag, the curved cover, and the flexible display device; and an extraction device configured to evacuate gas from the closed chamber before infusing the gas into the flexible bag.

In the above apparatus for manufacturing the curved display panel, the liquid substance comprises a mixture of a liquid and a solid powder or a liquid metal.

In the above apparatus for manufacturing the curved display panel, in response to the liquid substance being the mixture of the liquid and the solid powder, the liquid substance comprises liquid concrete; and in response to the liquid substance being the liquid metal, the liquid substance is selected from the group consisting of mercury, gallium, and cesium.

A apparatus for manufacturing a curved display panel includes: a carrying machine configured to carry a curved cover; a flexible bag configured to fasten a flexible display device which is to be attached to the curved cover, wherein the flexible display device is disposed below the flexible bag in a vertical direction; a supporting machine configured to fasten the flexible bag, wherein the flexible bag is disposed below the supporting machine in the vertical direction; and an infusion equipment configured to infuse a liquid substance into the flexible bag when at least one portion of the flexible display device is located above the curved cover in the vertical direction, such that the flexible display device is attached to a central area and a bending area of an inner surface of the curved cover under a pressure applied by the liquid substance.

In the above apparatus for manufacturing the curved display panel, the infusion equipment is further configured to infuse a gas into the flexible bag before infusing the liquid substance into the flexible bag, such that the flexible display device is bent under a tension applied by the flexible bag In the above apparatus for manufacturing the curved display panel, the apparatus further includes: a closed chamber configured to accommodate the supporting machine, the carrying machine, the flexible bag, the curved cover, and the flexible display device; and an extraction device configured to evacuate gas from the closed chamber before infusing the gas into the flexible bag.

In the above apparatus for manufacturing the curved display panel, the liquid substance is configured to apply the pressure to the flexible display device through the flexible bag to eliminate a gap between the flexible display device and the bending area of the inner surface of the curved cover during a process of bonding the flexible display device to the curved cover.

In the above apparatus for manufacturing the curved display panel, the liquid substance comprises a mixture of a liquid and a solid powder or a liquid metal.

In the above apparatus for manufacturing the curved display panel, in response to the liquid substance being the mixture of the liquid and the solid powder, the liquid substance comprises liquid concrete; and in response to the liquid substance being the liquid metal, the liquid substance is selected from the group consisting of mercury, gallium, and cesium.

In the above apparatus for manufacturing the curved display panel, the supporting machine is further configured to move the flexible display device toward the curved cover by the flexible bag, such that the flexible display device is located above the curved cover in the vertical direction.

In the above apparatus for manufacturing the curved display panel, the supporting machine is further configured to move the flexible display device in a bending state along the vertical direction toward the curved cover in a case where the gas is filled in the flexible bag, such that at least one portion of the flexible display device in the bending state is in contact with the central area of the inner surface of the curved cover.

The present disclosure also provides a method for manufacturing the curved display panel, including: A, fastening the flexible bag to the flexible display device which is to be attached to the curved cover, wherein the flexible display device is disposed below the flexible bag in the vertical direction; and B, infusing, by the liquid substance, the liquid substance into the flexible bag when the at least one portion of the flexible display device is located above the curved cover in the vertical direction, such that the flexible display device is attached to the central area and the bending area of the inner surface of the curved cover under the pressure applied by the liquid substance.

In the above method for manufacturing the curved display panel, before the step B, the method further comprises: C, infusing, by the infusion equipment, the gas into the flexible bag, such that the flexible display device is bent under the tension applied by the flexible bag.

In the above method for manufacturing the curved display panel, between the step B and the step C, the method further comprises: G, moving, by the supporting machine, the flexible display device in a bending state along the vertical direction toward the curved cover in a case where the gas is filled in the flexible bag, such that at least one portion of the flexible display device in the bending state is in contact with the central area of the inner surface of the curved cover.

In the above method for manufacturing the curved display panel, before the step C, the method further comprises: D, evacuating, by an extraction device, gas from a closed chamber accommodating the supporting machine, the carrying machine, the flexible bag, the curved cover, and the flexible display device before infusing the gas into the flexible bag.

In the above method for manufacturing the curved display panel, the liquid substance is configured to apply the pressure to the flexible display device through the flexible bag to eliminate a gap between the flexible display device and the bending area of the inner surface of the curved cover during a process of bonding the flexible display device to the curved cover.

In the above method for manufacturing the curved display panel, before the step B, the method further comprises: E, disposing the curved cover on the carrying machine, wherein the inner surface of the curved cover faces an upper side of the vertical direction.

In the above method for manufacturing the curved display panel, before the step B, the method further comprises: F, moving, by the supporting machine, the flexible display device toward the curved cover by the flexible bag, such that the flexible display device is located above the curved cover in the vertical direction.

In the above method for manufacturing the curved display panel, the method further comprises: H, after infusing the liquid substance into the flexible bag, sequentially infusing, by the infusion equipment, the gas into the flexible bag to push the liquid substance to apply the pressure to the flexible display device by using the gas.

In comparison to prior art, the present disclosure infuses a liquid substance into a flexible bag by bonding a flexible display device to an inner surface of a curved cover, and applies pressure to the flexible display device by the liquid substance, such that the flexible display device is completely attached with the inner surface of the curved cover. Therefore, it is possible to avoid a gap presented between the flexible display device and the curved cover at a position corresponding to a bending portion of the curved cover.

In order to make the above description of the present disclosure more clear, the preferred embodiments are described below, and are described in detail below with reference to the accompanying drawings.

DESCRIPTION OF SPECIFIC EMBODIMENTS OF THE INVENTION

The term "embodiment" as used in this specification means serving as an example, implementation, or illustration. Furthermore, the articles "a" or "an" as used in the specification and the appended claims may generally be construed to mean "one or more" unless it is clearly specified to be the singular form in the context.

Referring to FIG. 1, FIG. 2, FIG. 3 and FIG. 4, which are schematic diagrams showing a scheme for manufacturing a curved display panel by an apparatus for manufacturing the curved display panel of the present disclosure.

The apparatus for manufacturing the curved display panel of the present disclosure includes a carrying machine 102, a flexible bag 103, a supporting machine 101, and an infusion equipment. The curved display panel of the present disclosure includes a curved cover 105 and a flexible display device 104.

The carrying machine 102 is configured to carry the curved cover 105. An inner surface of the curved cover 105 faces an upper side of the vertical direction.

The flexible bag 103 is configured to fasten the flexible display device 104 which is to be attached to the curved cover 105. The flexible display device 104 is disposed below the flexible bag 103 in a vertical direction. The flexible display device 104 can be, for example, an organic light emitting diode (OLED) display device. The flexible bag 103 is used to accommodate a gas, a liquid, and a liquid substance 301. The flexible bag 103 can be, for example, an airbag, a liquid bag.

The supporting machine 101 is configured to fasten the flexible bag 103, and the flexible bag 103 is disposed below the supporting machine 101 in the vertical direction.

The infusion equipment is configured to infuse the liquid substance 301 into the flexible bag 103 when at least one portion of the flexible display device 104 is located above the curved cover 105 in the vertical direction, such that the flexible display device 104 is attached to a central area and bending areas of an inner surface of the curved cover 105 under a pressure applied by the liquid substance 301.

The bending areas are located on both sides of the central area.

The pressure corresponds to a gravity of the liquid substance 301.

The infusion equipment is further configured to infuse the gas into the flexible bag 103 before infusing the liquid substance 301 into the flexible bag 103, such that the flexible display device 104 is bent under a tension applied by the flexible bag 103. Specifically, when the at least one portion of the flexible display device 104 is located above the transparent cover 105 in the vertical direction, the infusion equipment is used to infuse the liquid substance 301 into the flexible bag 103, such that the flexible display device 104 in a bending state is in contact with the central area and the bending areas of the inner surface of the curved cover 105 under the pressure applied by the liquid substance 301.

The apparatus also includes a closed chamber and an extraction device.

The closed chamber is configured to accommodate the supporting machine 101, the carrying machine 102, the flexible bag 103, the curved cover 104, and the flexible display device 104.

The extraction device is configured to evacuate gas from the closed chamber before infusing the gas into the flexible bag 103.

The liquid substance 301 is configured to apply the pressure to the flexible display device 104 through the flexible bag 103 to eliminate a gap between the flexible display device 104 and the bending area of the inner surface of the curved cover during a process of bonding the flexible display device 104 to the curved cover 105.

The liquid substance 301 is a mixture of a liquid and a solid powder or a liquid metal.

If the liquid substance 301 is the mixture of the liquid and the solid powder, the liquid substance 301 is liquid concrete.

If the liquid substance 301 is the liquid metal, the liquid substance 301 is selected from the group consisting of mercury, gallium, and cesium.

As an improvement, the supporting machine 101 is further configured to move the flexible display device 104 toward the curved cover 105 by the flexible bag 103, such that the flexible display device 104 is located above the transparent cover 105 in the vertical direction.

The supporting machine 101 is further configured to move the flexible display device 104 in a bending state along the vertical direction toward the curved cover 105 in a case where the gas is filled in the flexible bag 103, such that at least one portion of the flexible display device 104 in the bending state is in contact with the central area of the inner surface of the curved cover 105.

The liquid substance 301 is configured to apply the pressure to the flexible display device 104 by the flexible bag 103 if the at least one portion of the flexible display device 104 is in contact with the central area of the inner surface of the curved cover 105, such that the flexible display device 104 is gradually attached to the bending areas of the inner surface of the curved cover 105 along the vertical direction from bottom to top.

The infusion equipment is further configured to sequentially infuse gas into the flexible bag after infusing the liquid substance into the flexible bag 103, to push the liquid substance to apply pressure to the flexible display device by using the gas.

Figure 1:
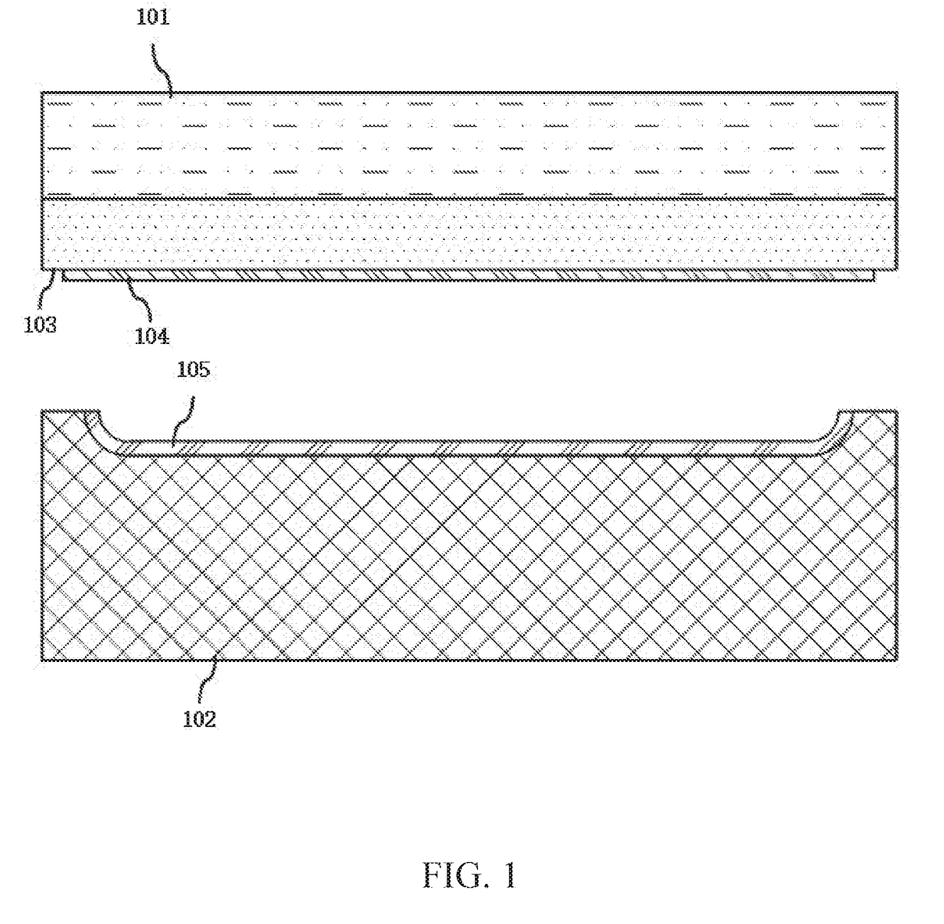
FIG. 1, FIG. 2, FIG. 3 and FIG. 4 are schematic diagrams showing a scheme for manufacturing a curved display panel by an apparatus for manufacturing the curved display panel of the present disclosure.
Figure 2:
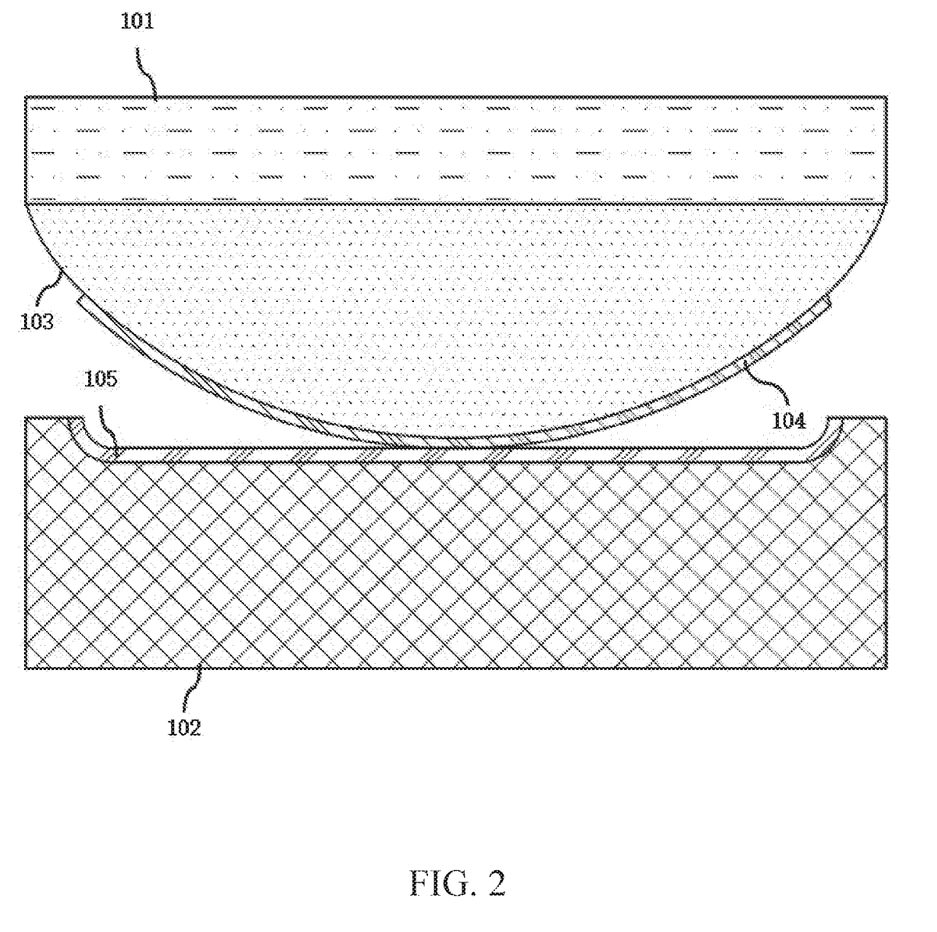
Figure 3:
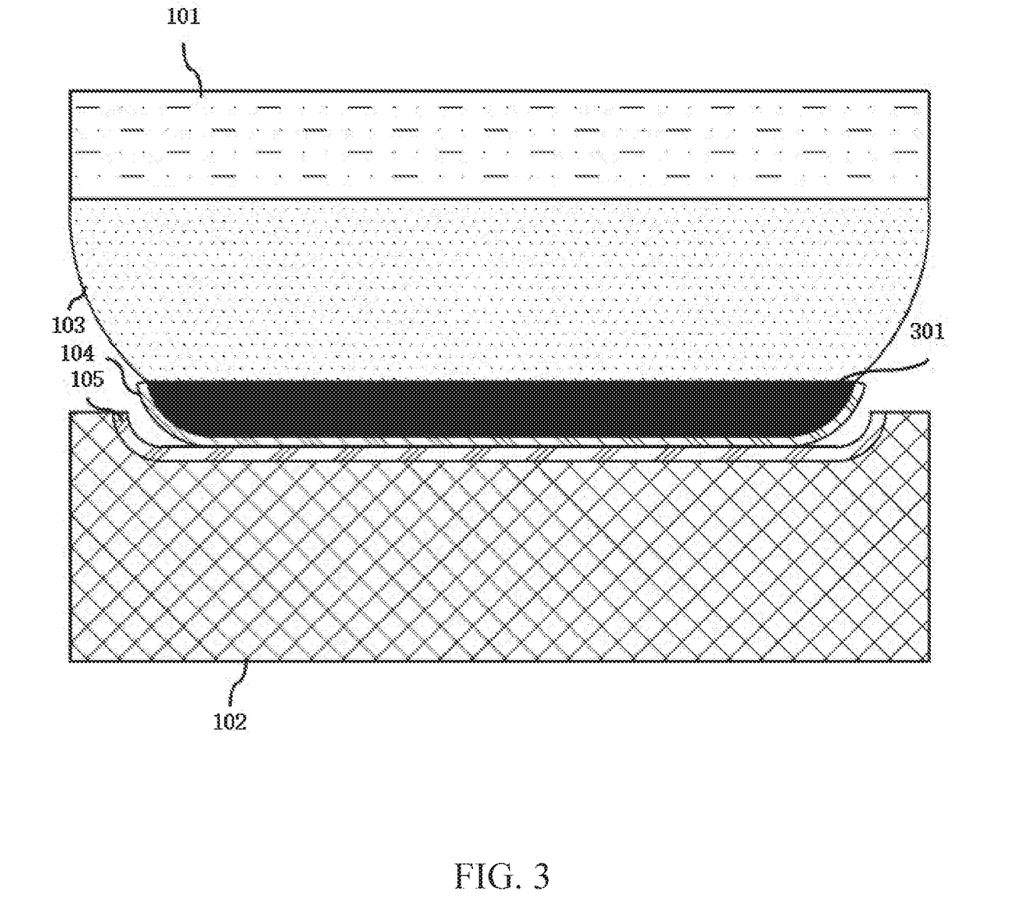
Figure 4:
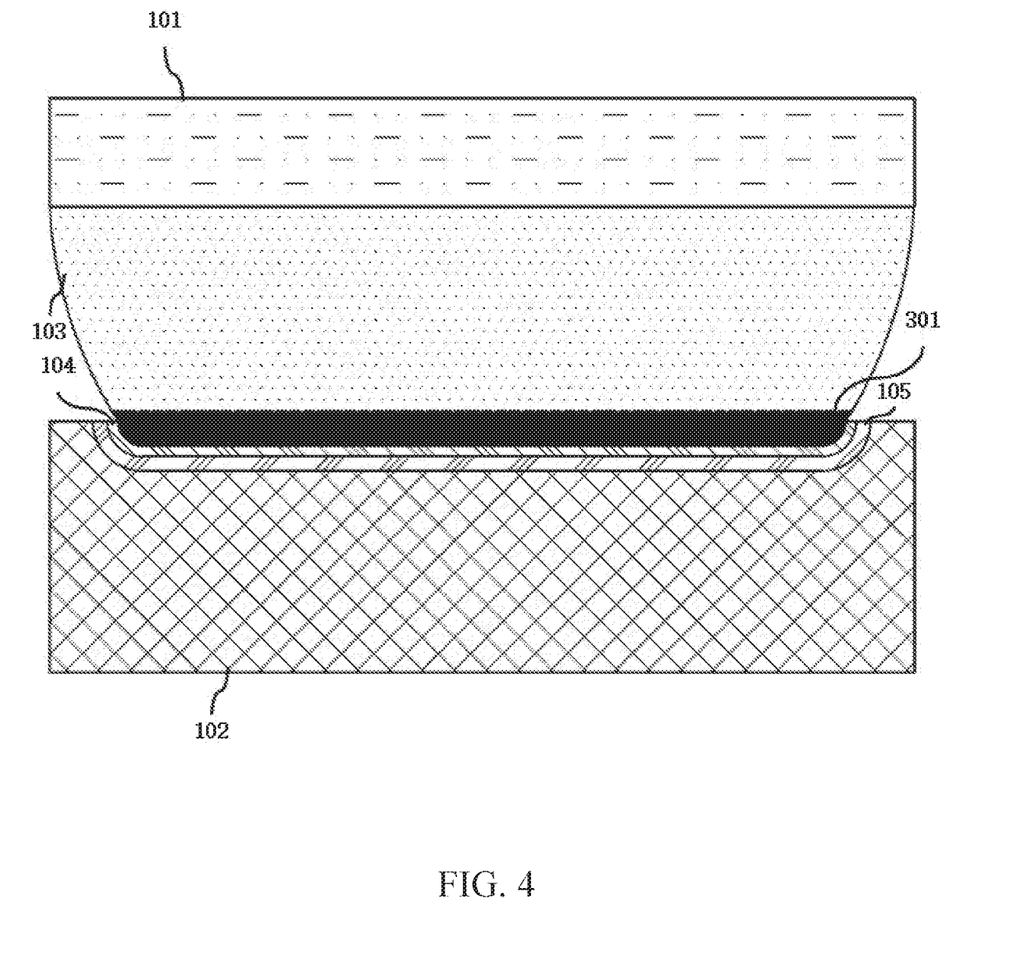
Figure 5:
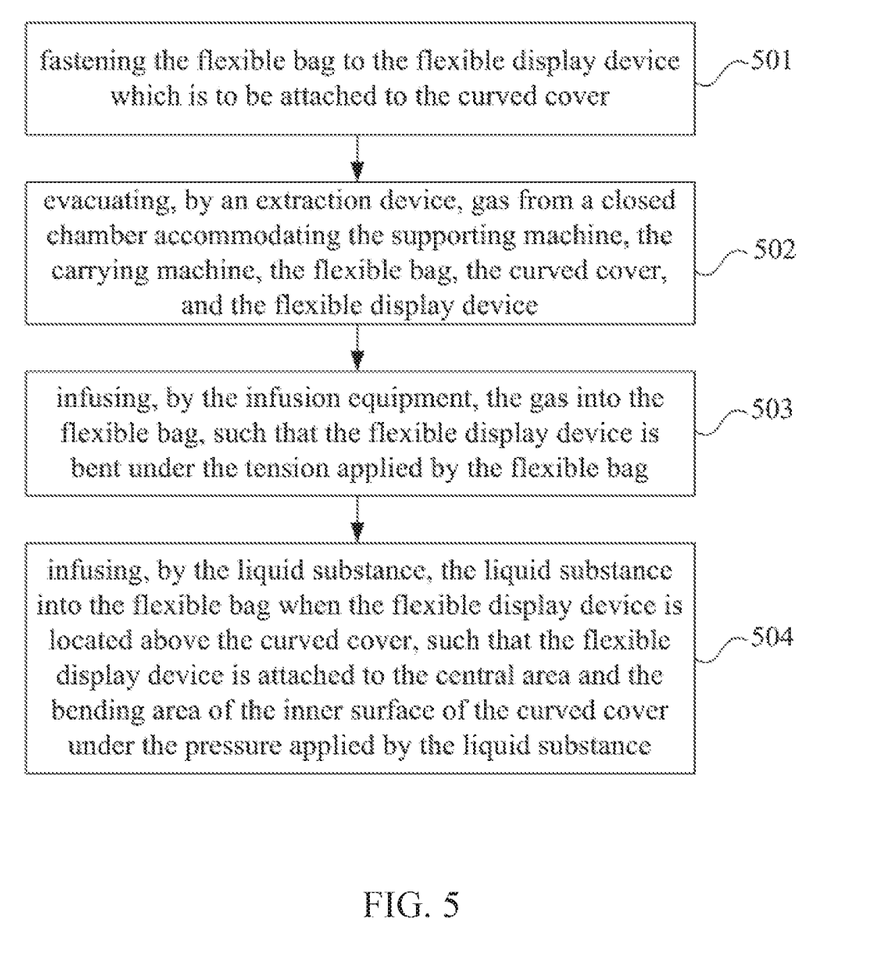
FIG. 5 is a flowchart of a method for manufacturing the curved display panel of the present disclosure.

Referring to FIG. 1, FIG. 2, FIG. 3, FIG. 4 and FIG. 5, where FIG. 1, FIG. 2, FIG. 3 and FIG. 4 are schematic diagrams showing the scheme for manufacturing the curved display panel by the apparatus for manufacturing the curved display panel of the present disclosure, and FIG. 5 is a flowchart of a method for manufacturing the curved display panel of the present disclosure.

The method for manufacturing the curved display panel of the present disclosure includes the following steps.

A (step 501), the flexible bag 103 is fastened to the flexible display device 104 which is to be attached to the curved cover 105. The flexible display device 104 is disposed below the flexible bag 103 in the vertical direction.

B (step 504), the liquid substance infuses the liquid substance 301 into the flexible bag 1003 when the at least one portion of the flexible display device 104 is located above the curved cover 105 in the vertical direction, such that the flexible display device 104 is attached to the central area and the bending area of the inner surface of the curved cover 105 under the pressure applied by the liquid substance 301.

Before the step B, the method further includes:

C (step 503), the infusion equipment infuses the gas into the flexible bag 103, such that the flexible display device 104 is bent under the tension applied by the flexible bag 103.

The step B is as follows.

The infusion equipment is configured to infuse the liquid substance 301 into the flexible bag 103 when at least one portion of the flexible display device 104 is located above the curved cover 105 in the vertical direction, such that the flexible display device 104 in the bending state is attached to a central area and bending areas of an inner surface of the curved cover 105 under a pressure applied by the liquid substance 301.

Before the step C, the method further includes:

D (step 502), an extraction device evacuates gas from a closed chamber accommodating the supporting machine 101, the carrying machine 102, the flexible bag 103, the curved cover 105, and the flexible display device 104 before infusing the gas into the flexible bag 103.

The liquid substance 301 is configured to apply the pressure to the flexible display device 104 through the flexible bag 103 to eliminate a gap between the flexible display device 104 and the bending area of the inner surface of the curved cover 105 during a process of bonding the flexible display device 104 to the curved cover 105.

Before the step B, the method further includes:

E, the curved cover 105 is disposed on the carrying machine 102. The inner surface of the curved cover 105 faces an upper side of the vertical direction.

As an improvement, before the step B, the method further includes the following steps.

F, the supporting machine moves the flexible display device 104 toward the curved cover 105 by the flexible bag 103, such that the flexible display device 104 is located above the curved cover 105 in the vertical direction.

Between the step B and the step C, the method further includes:

G, the supporting machine 101 moves the flexible display device 104 in a bending state along the vertical direction toward the curved cover 105 in a case where the gas is filled in the flexible bag 103, such that at least one portion of the flexible display device 104 in the bending state is in contact with the central area of the inner surface of the curved cover 105.

As an improvement, the method further includes the following step.

H, after infusing the liquid substance into the flexible bag 103, the infusion equipment sequentially infuses the gas into the flexible bag 103 to push the liquid substance to apply the pressure to the flexible display device by using the gas.

By the above technical solutions, the present disclosure infuses the liquid substance into the flexible bag while bonding the flexible display device to the inner surface of the curved cover by using the flexible bag, and applies pressure to the flexible display device by the liquid substance, such that the flexible display device is completely attached with the inner surface of the curved cover. Therefore, it is possible to avoid the gap generated between the flexible display device and the curved cover at a position corresponding to the bending portion of the curved cover.

In summary, although the preferable embodiments of the present disclosure have been disclosed above, the embodiments are not intended to limit the present disclosure. A person of ordinary skill in the art, without departing from the spirit and scope of the present disclosure, can make various modifications and variations. Therefore, the scope of the disclosure is defined in the appended claims.

What is claimed is:

1. A device for manufacturing a curved display panel, comprising:
    a carrying machine configured to carry a curved cover;
    a flexible bag configured to fasten a flexible display device which is to be attached to the curved cover, wherein the flexible display device is disposed below the flexible bag in a vertical direction;
    a supporting machine configured to fasten the flexible bag, wherein the flexible bag is disposed below the supporting machine in the vertical direction; and
    an infusion equipment configured to infuse a liquid substance into the flexible bag when at least one portion of the flexible display device is located above the curved cover in the vertical direction, such that the flexible display device is attached to a central area and a bending area of an inner surface of the curved cover under a pressure applied by the liquid substance;
    wherein the infusion equipment is further configured to infuse a gas into the flexible bag before infusing the liquid substance into the flexible bag, such that the flexible display device is bent under a tension applied by the flexible bag; and
    the liquid substance is configured to apply the pressure to the flexible display device through the flexible bag to eliminate a gap between the flexible display device and the bending area of the inner surface of the curved cover during a process of bonding the flexible display device to the curved cover.

2. The device for manufacturing the curved display panel as claimed in claim 1, further comprising:
    a closed chamber configured to accommodate the supporting machine, the carrying machine, the flexible bag, the curved cover, and the flexible display device; and
    an extraction device configured to evacuate gas from the closed chamber before infusing the gas into the flexible bag.

3. The device for manufacturing the curved display panel as claimed in claim 1, wherein the liquid substance comprises a mixture of a liquid and a solid powder or a liquid metal.

4. The device for manufacturing the curved display panel as claimed in claim 3, wherein in response to the liquid substance being the mixture of the liquid and the solid powder, the liquid substance comprises liquid concrete; and
    in response to the liquid substance being the liquid metal, the liquid substance is selected from the group consisting of mercury, gallium, and cesium.

5. A device for manufacturing a curved display panel, comprising:
    a carrying machine configured to carry a curved cover;
    a flexible bag configured to fasten a flexible display device which is to be attached to the curved cover, wherein the flexible display device is disposed below the flexible bag in a vertical direction;
    a supporting machine configured to fasten the flexible bag, wherein the flexible bag is disposed below the supporting machine in the vertical direction; and
    an infusion equipment configured to infuse a liquid substance into the flexible bag when at least one portion of the flexible display device is located above the curved cover in the vertical direction, such that the flexible display device is attached to a central area and a bending area of an inner surface of the curved cover under a pressure applied by the liquid substance.

6. The device for manufacturing the curved display panel as claimed in claim 5, wherein the infusion equipment is further configured to infuse a gas into the flexible bag before infusing the liquid substance into the flexible bag, such that the flexible display device is bent under a tension applied by the flexible bag.

7. The device for manufacturing the curved display panel as claimed in claim 6, further comprising:
    a closed chamber configured to accommodate the supporting machine, the carrying machine, the flexible bag, the curved cover, and the flexible display device; and
    an extraction device configured to evacuate gas from the closed chamber before infusing the gas into the flexible bag.

8. The device for manufacturing the curved display panel as claimed in claim 5, wherein the liquid substance is configured to apply the pressure to the flexible display device through the flexible bag to eliminate a gap between the flexible display device and the bending area of the inner surface of the curved cover during a process of bonding the flexible display device to the curved cover.

9. The device for manufacturing the curved display panel as claimed in claim 5, wherein the liquid substance comprises a mixture of a liquid and a solid powder or a liquid metal.

10. The device for manufacturing the curved display panel as claimed in claim 9, wherein in response to the liquid substance being the mixture of the liquid and the solid powder, the liquid substance comprises liquid concrete; and
    in response to the liquid substance being the liquid metal, the liquid substance is selected from the group consisting of mercury, gallium, and cesium.

11. The device for manufacturing the curved display panel as claimed in claim 5, wherein the supporting machine is further configured to move the flexible display device toward the curved cover by the flexible bag, such that the flexible display device is located above the curved cover in the vertical direction.

12. The device for manufacturing the curved display panel as claimed in claim 5, wherein the supporting machine is further configured to move the flexible display device in a bending state along the vertical direction toward the curved cover in a case where the gas is filled in the flexible bag, such that at least one portion of the flexible display device in the bending state is in contact with the central area of the inner surface of the curved cover.

13. A method for manufacturing the curved display panel according to claim 5, comprising:

A, fastening the flexible bag to the flexible display device which is to be attached to the curved cover, wherein the flexible display device is disposed below the flexible bag in the vertical direction; and B, infusing, by the liquid substance, the liquid substance into the flexible bag when the at least one portion of the flexible display device is located above the curved cover in the vertical direction, such that the flexible display device is attached to the central area and the bending area of the inner surface of the curved cover under the pressure applied by the liquid substance.

14. The method for manufacturing the curved display panel as claimed in claim 13, wherein before the step B, the method further comprises:

C, infusing, by the infusion equipment, the gas into the flexible bag, such that the flexible display device is bent under the tension applied by the flexible bag.

15. The method for manufacturing the curved display panel as claimed in claim 14, wherein between the step B and the step C, the method further comprises:

G, moving, by the supporting machine, the flexible display device in a bending state along the vertical direction toward the curved cover in a case where the gas is filled in the flexible bag, such that at least one portion of the flexible display device in the bending state is in contact with the central area of the inner surface of the curved cover.

16. The method for manufacturing the curved display panel as claimed in claim 14, wherein before the step C, the method further comprises:

D, evacuating, by an extraction device, gas from a closed chamber accommodating the supporting machine, the carrying machine, the flexible bag, the curved cover, and the flexible display device before infusing the gas into the flexible bag.

17. The method for manufacturing the curved display panel as claimed in claim 13, wherein the liquid substance is configured to apply the pressure to the flexible display device through the flexible bag to eliminate a gap between the flexible display device and the bending area of the inner surface of the curved cover during a process of bonding the flexible display device to the curved cover.

18. The method for manufacturing the curved display panel as claimed in claim 13, wherein before the step B, the method further comprises:

E, disposing the curved cover on the carrying machine, wherein the inner surface of the curved cover faces an upper side of the vertical direction.

19. The method for manufacturing the curved display panel as claimed in claim 13, wherein before the step B, the method further comprises:

F, moving, by the supporting machine, the flexible display device toward the curved cover by the flexible bag, such that the flexible display device is located above the curved cover in the vertical direction.

20. The method for manufacturing the curved display panel as claimed in claim 13, wherein the method further comprises:

H, after infusing the liquid substance into the flexible bag, sequentially infusing, by the infusion equipment, the gas into the flexible bag to push the liquid substance to apply the pressure to the flexible display device by using the gas.

* * * * *